(12) United States Patent
Mirzaei et al.

(10) Patent No.: US 7,298,183 B2
(45) Date of Patent: Nov. 20, 2007

(54) HIGH FREQUENCY DIVIDER CIRCUITS AND METHODS

(75) Inventors: Ahmad Mirzaei, Los Angeles, CA (US); Mohammad E Heidari, Los Angeles, CA (US); Masoud Djafari, Marina Del Rey, CA (US); Rahim Bagheri, Los Angeles, CA (US)

(73) Assignee: WiLinx Corp., Los Angeles, CA (US)

( * ) Notice: Subject to any disclaimer, the term of this patent is extended or adjusted under 35 U.S.C. 154(b) by 0 days.

(21) Appl. No.: 11/142,705

(22) Filed: Jun. 1, 2005

(65) Prior Publication Data

US 2007/0024330 A1    Feb. 1, 2007

(51) Int. Cl.
*H03K 21/00* (2006.01)
(52) U.S. Cl. ........................ 327/115; 327/117
(58) Field of Classification Search ............. 327/117, 327/115
See application file for complete search history.

(56) References Cited

U.S. PATENT DOCUMENTS

| | | | |
|---|---|---|---|
| 5,907,598 A | | 5/1999 | Mandalia et al. |
| 6,163,181 A | * | 12/2000 | Nishiyama ............... 327/115 |
| 6,683,480 B2 | * | 1/2004 | Zhang et al. ............. 327/115 |
| 2002/0097072 A1 | * | 7/2002 | Wakada et al. ........... 327/117 |
| 2003/0048117 A1 | * | 3/2003 | Tung et al. .............. 327/115 |
| 2003/0189449 A1 | * | 10/2003 | Zhang et al. ............. 327/115 |
| 2003/0193355 A1 | * | 10/2003 | Leifso et al. ............ 327/115 |
| 2004/0140831 A1 | * | 7/2004 | Wang .................... 327/115 |

OTHER PUBLICATIONS

Hung, et al. "Fully Integrated 5.35-GHz CMOS VCOs and Prescalers", IEEE Transactions on Microwave Theory and Techniques, vol. 49, No. 1, Jan. 2001, pp. 17-22.
Fujishima, et al., "A 1.0V 10.2 CHz CMOS Frequency Divider with Differential Injection Locking", IEEE Topical Conference on Wireless Communication Technology 2003, pp. 164-165.
Craninckx, et al., "A CMOS 1.8GHz Los-Phase-Noise Voltage-Contollered Oscillator with Prescaler", IEEE International Solid-State Circuits Conference 1995, pp. 266-267.
Betancourt-Zamora, "1-GHz and 2.8-GHz CMOS Injection-locked Ring Oscillator Prescsller", Symosium on VLSI Circuits, Kyoto, Japan, Jun. 14, 2001.

* cited by examiner

*Primary Examiner*—Linh My Nguyen
*Assistant Examiner*—Khaeem E. Almo
(74) *Attorney, Agent, or Firm*—Fountainhead Law Group P.C.; Chad R. Walsh

(57) ABSTRACT

Embodiments of the present invention include circuits and methods for dividing high frequency signals. In one embodiment the present invention includes a divider circuit comprising a differential circuit having first and second inputs to receive a first differential signal, a first frequency control input and first and second differential outputs, wherein the differential circuit has a first bias current. The divider circuit further includes a cross-coupled circuit having outputs coupled to the differential circuit outputs and a second frequency control input, wherein the cross-coupled circuit has a second bias current. Embodiments of the present invention may include circuits for controlling the relationship between bias currents and circuit parameters that vary with process or temperature or both.

30 Claims, 8 Drawing Sheets

HIGH FREQUENCY DIVIDER CIRCUITS AND METHODS

BACKGROUND

The present invention relates to divider circuits, and in particular, to circuits and methods that may be used to implement a high frequency division.

Electronic systems often have many different components that include voltage or current signals that have different frequencies. It is often desirable to modify the frequencies of such signals as the signals are used to perform different tasks. One common modification to a signal is frequency division. Frequency division is the process of dividing a signal's frequency by some value (e.g., an integer or fraction). Circuits that perform frequency division are referred to as "Dividers" and are found in a wide variety of electronic applications.

FIG. 1 illustrates a prior art divider circuit. A divider circuit 100 receives an input signal, Vin, and generates an output signal, Vout. The input signal, Vin, may be a square wave, for example, having a period, T1, and a corresponding frequency, F1=1/T1. The output signal, Vout, of divider circuit 100 may have some frequency that is less than the frequency of the input signal, Vin. For example, the output signal, Vout, may have a period, T2, that is twice the value of the input signal period, T1, and thus the output frequency, Fout, has a frequency that is one-half the frequency of the input signal, Vin.

FIG. 2 illustrates a prior art D-Flip Flop divider circuit. The circuit includes two D-flip flops ("DFF") 201 and 202 connected in series. In this example, each DFF has differential inputs (+in, −in), differential outputs (+out, −out) and differential clock inputs (CK and $\overline{CK}$). DFF 201 will load data at its input (i.e., from DFF 202) on the rising edge of CK. Similarly, DFF 202 will load data at its input (i.e., from DFF 201) on the falling edge of CK, which is the rising edge of $\overline{CK}$. Thus, each DFF output will transition between logic states once for every period of CK. Consequently, the period of each DFF output is twice the period of the clock, and the output of the divider (+OUT_DIV2, −OUT_DIV2) has one-half the frequency of the clock. DFFs 201 and 202 have, thus, divided the clock frequency by two. Such a circuit is one example of a divide-by-two circuit.

FIG. 3 illustrates another prior art divider circuit 300. Divider 300 shows an implementation of the divider of FIG. 2. Divider 300 includes two differential DFFs. The first DFF includes a first pair of differential transistors M3 and M4 having common sources coupled to ground through transistor M1. The first DFF further includes cross-coupled transistors M5 and M6. M5 and M6 have common sources that are similarly coupled together and to ground through transistor M2. Transistors M5 and M6 form a cross-coupled circuit because the inputs are coupled to the circuit's complementary output. In divider circuit 300, the gate of M5 is coupled to the drain of M6, and the gate of M6 is coupled to the drain of M5. Furthermore, the drain of M5 is coupled to the drain of M4 and the drain of M6 is coupled to the drain of M3. Thus, the cross-coupled devices and the differential pair transistors have common outputs. Differential pair transistors M3/M4 and cross-coupled pair transistors M5/M6 receive bias current from PMOS transistors M7 and M8, which have sources coupled to supply Vdd and gates coupled to a bias voltage Vbias. Transistors M7 and M8 also provide a load impedance to both the differential and cross-coupled pairs.

When transistor M1 receives rising edge transition of the clock input, CK, M1 turns on and activates differential pair M3/M4. Thus, signal values at the gate inputs of M3/M4 (i.e., +in1 and −in1) will drive the outputs of the first DFF (i.e., −out1 and +out1) on the rising edge of CK. During this phase of the clock signal, bias current from transistors M7/M8 is directed through M3, M4 and M1, and the data value at the gate input is stored on the output nodes of the differential pair M3 and M4. When transistor M2 receives a rising edge transition of $\overline{CK}$ (i.e., the falling edge of CK), M2 turns on while M1 turns off, and cross-coupled pair M5/M6 is activated. During this phase of the clock signal, bias current from transistors M7 and M8 is redirected through M5, M6 and M2, and the data value in the first DFF is maintained by the cross-coupled pair.

The second DFF stage includes transistors M9-M16 connected is the same way as transistors M1-M8 in the first DFF stage. The rising edge of $\overline{CK}$ triggers the differential input of the second DFF stage (i.e., transistors M11/M12), which causes the data value from the first DFF to drive the outputs of the second DFF. Thus, the signal values at the gate inputs of M11 and M12 (i.e., −in2 and +in2) will drive the outputs of the second DFF (+out2 and −out2) on the rising edge of $\overline{CK}$. Referring again to FIG. 2, the two DFFs form a two-stage ring oscillator. The outputs of the second DFF are cross-coupled to the inputs of the first DFF, wherein the positive output of the second DFF (i.e., +out2) is coupled to the negative input of the first DFF (i.e., −in1) and the negative output of the second DFF (i.e., −out2) is coupled to the positive input of the first DFF (i.e., +in1). Thus, the two DFFs operate in opposite states and transition at a frequency of one-half the clock frequency. FIG. 4 illustrates an equivalent implementation wherein resistors and capacitors are used for the load impedance, and bias current is generated using a current source "I" coupled to the sources of transistors M1, M2, M7 and M8.

In high frequency applications, each DFF stage, such as the ones in FIGS. 3-4, may be interpreted as injection-locked oscillators. For example, cross-coupled transistors M5 and M6, together with load transistors M7 and M8 form an oscillator having a center frequency, $\omega_c$. When an input signal is provided (e.g., the clock signal in FIG. 3), the divider circuit oscillates at one-half the frequency of the input. However, if the input signal amplitude is too small, or if the frequency of the input signal is outside the lock range of the circuit, then the divider circuit will self-oscillate at a frequency determined by the fundamental frequency (i.e., the center frequency), $\omega_c$, of each DFF stage. Thus, in high frequency applications the circuit may operate properly only if the input signal to be divided is within a certain range of frequencies (i.e., the lock range) near the center frequency of the oscillator. To optimize the lock range, it is desirable to have the center frequency, $\omega_c$, as close to the center of the lock range as possible. When the center frequency is in the center of the lock range, the input signal may deviate both above and below the center frequency an approximately equal amount and the system will still lock. However, the center frequency of such circuits is subject to deviation from process and temperature variations. These variations can reduce the effective lock range of the circuit, and may cause the circuit to become inoperable.

Thus, there is a need for improved divider circuits, and in particular, for improved circuits and methods that may be used to implement high frequency division with optimized lock range.

SUMMARY

Embodiments of the present invention improve high frequency performance of divider circuits. In one embodiment, the present invention includes a divider circuit comprising a differential circuit having first and second inputs to receive a first differential signal, a first frequency control input and first and second differential output nodes, wherein the differential circuit has a first bias current, and a cross-coupled circuit having a first control terminal coupled to a second output of the cross-coupled circuit and the first differential output node, a second control terminal coupled to a first output of the cross coupled circuit and the first differential output node, and a second frequency control input, wherein the cross-coupled circuit has a second bias current that is independent of the first bias current.

In another embodiment, the second bias current is a constant current and the first bias current is calibrated so that the ratio of the first bias current and a resistance is a constant. In yet another embodiment, the first bias current is a constant current and the second bias current is calibrated so that the product of the second bias current and a resistance is a constant.

In another embodiment, the present invention includes a first resistor having a first resistance coupled between the first differential output node and a supply terminal and a second resistor having a second resistance coupled between the second differential output node and the supply terminal. The first bias current may be generated by a first bias generator that is calibrated so that the ratio of the first bias current and the first or second resistance is a constant across process or temperature. In another embodiment, the second bias current is generated by a second bias generator that is calibrated so that the product of the second bias current and the first or second resistance is a constant across process or temperature.

In another embodiment, the present invention includes a load impedance coupled between first and second differential output nodes and a supply voltage, the load impedance including a control terminal for changing the impedance between the first and second differential output nodes and the supply voltage.

In another embodiment, the present invention includes a divider circuit comprising a differential circuit having first and second inputs to receive a first differential signal, a first frequency control input and first and second differential output nodes, wherein the differential circuit is coupled to a first bias current generator, and a cross-coupled circuit having a first control terminal coupled to a second output of the cross-coupled circuit and the first differential output node, a second control terminal coupled to a first output of the cross coupled circuit and the first differential output node, and a second frequency control input, wherein the cross-coupled circuit is coupled to a second bias current generator.

In another embodiment, the present invention includes a divider circuit comprising first and second transistors having sources coupled together to form a differential circuit, the first transistor having a first output terminal and the second transistor having a second output terminal, first and second cross-coupled transistors having sources coupled together, the first cross-coupled transistor having a first output terminal coupled to the first output terminal of the first transistor and the second cross-coupled transistor having a second output terminal coupled to the second output terminal of the second transistor, a first resistor coupled between the first output terminal of the first transistor and a supply terminal, the first resistor having a first resistance value, a second resistor coupled between the second output terminal of the second transistor and the supply terminal, the second resistor having a second resistance value approximately equal to the first resistance value, a third transistor having a control terminal coupled to a signal to be divided and a first terminal coupled to the sources of the first and second transistors, wherein the third transistor is coupled to a first bias generator that generates first bias current in the first and second transistors, and a fourth transistor having an control terminal coupled to a complement of the signal to be divided and a first terminal coupled to the sources of the cross-coupled transistors, wherein the fourth transistor is coupled to a second bias generator that generates second bias current in the first and second cross-coupled transistors.

The following detailed description and accompanying drawings provide a better understanding of the nature and advantages of the present invention.

DETAILED DESCRIPTION

Described herein are techniques for implementing high frequency division with optimized lock range. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
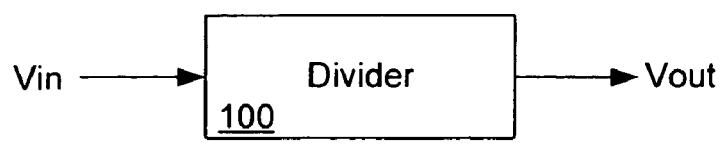
FIG. 1 illustrates a prior art divider circuit.
Figure 1:
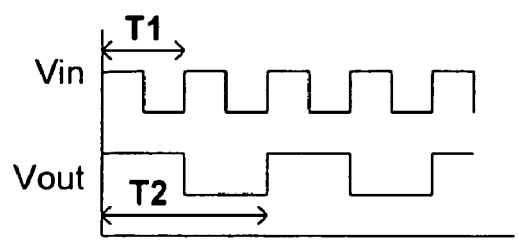
Figure 2:
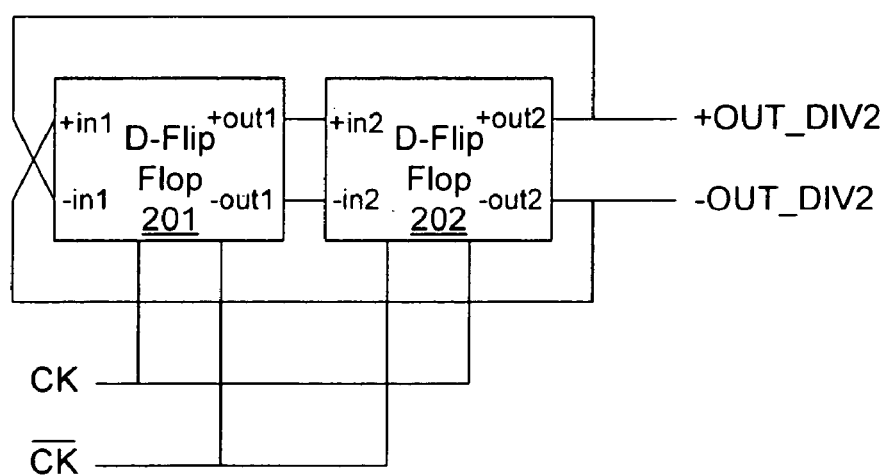
FIG. 2 illustrates a prior art D-Flip Flop divider circuit.
Figure 3:
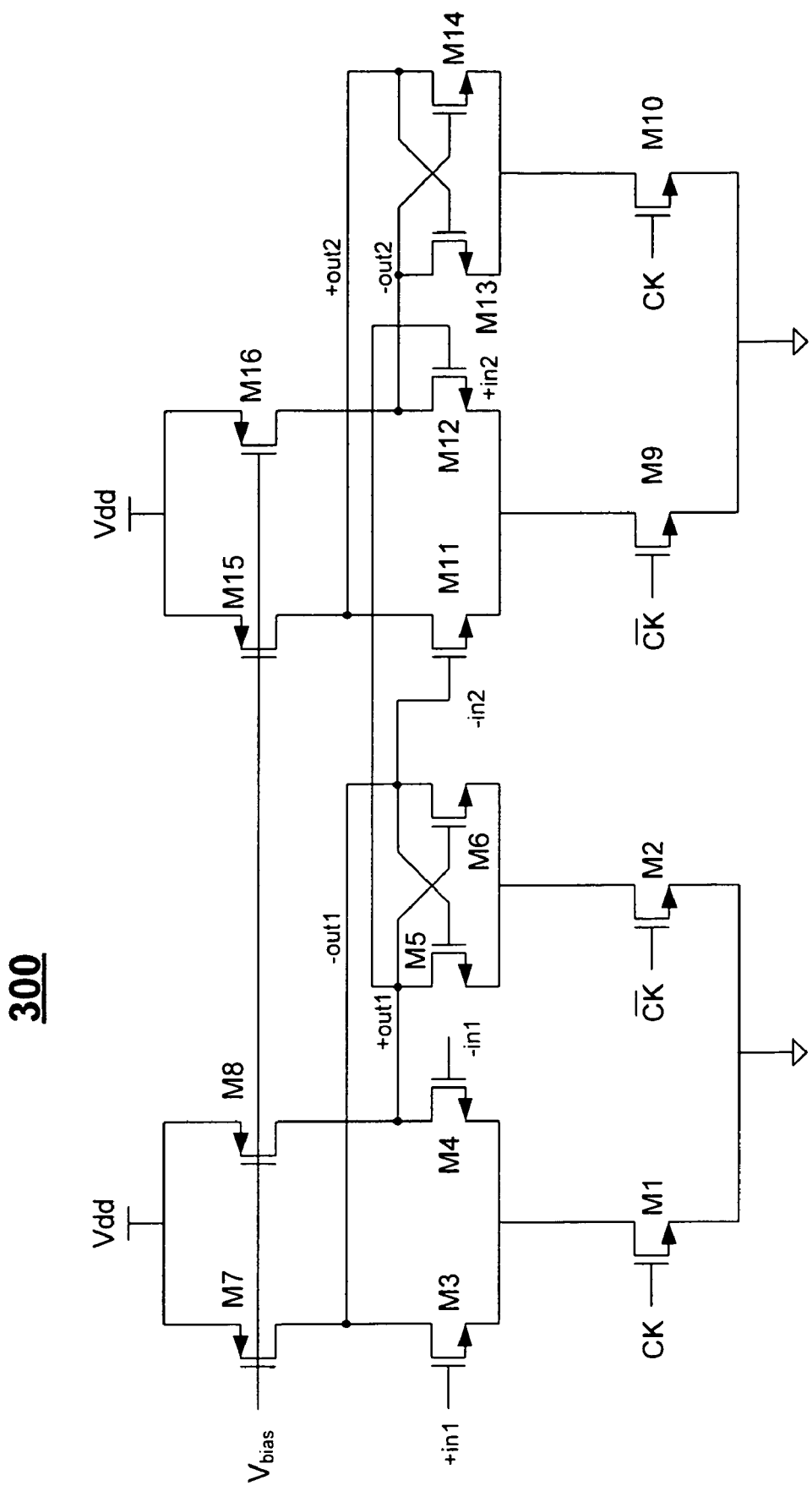
FIG. 3 illustrates another prior art divider circuit.
Figure 4:
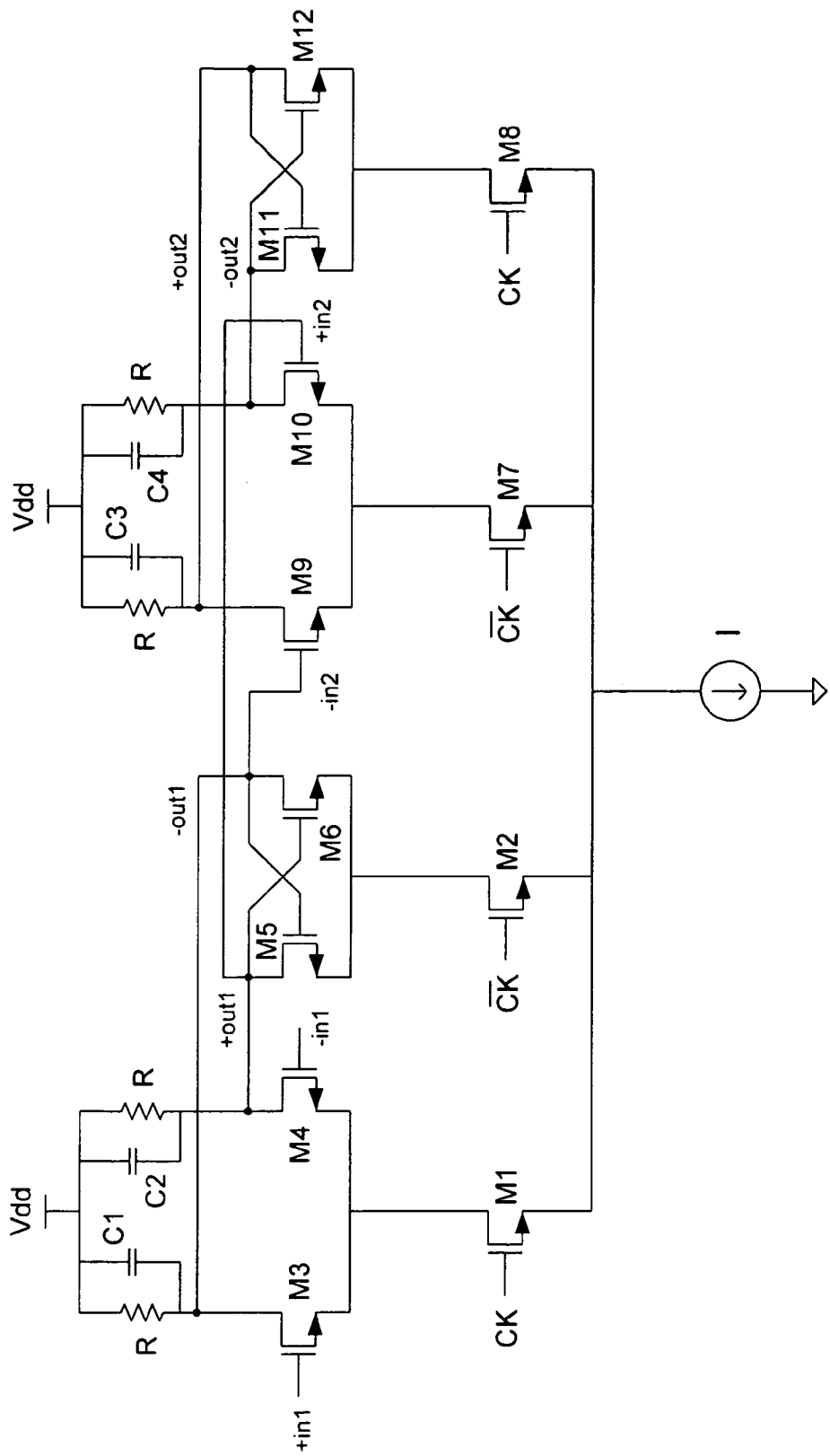
FIG. 4 illustrates yet another prior art divider circuit.
Figure 5:
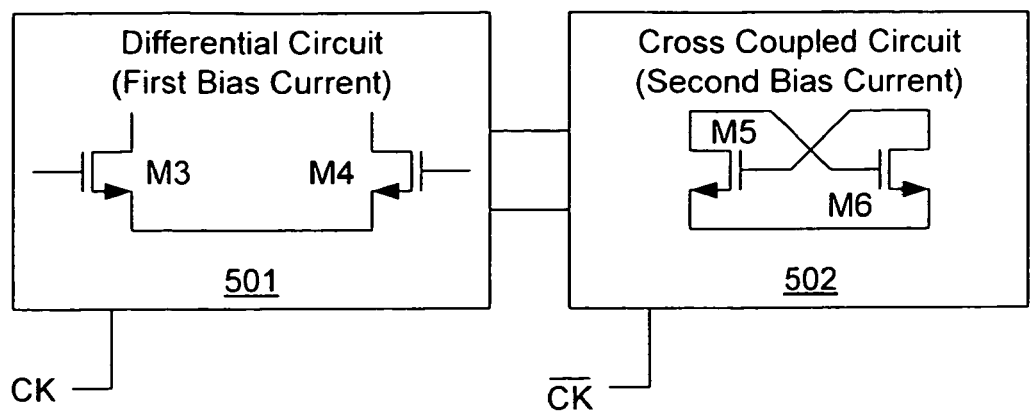
FIG. 5 illustrates one aspect of the present invention.

FIG. 5 illustrates one aspect of the present invention. In contemporary electronic circuits such as those described in FIG. 3 and FIG. 4, the differential circuits and cross-coupled circuits operate using the same bias current. One aspect of the present invention includes operating a differential circuit 501 using a first bias current and operating a cross-coupled circuit 502 using a second bias current. The two bias currents may be substantially independent to a first order, for example. The differential circuit may include a frequency control input to receive a first input signal to be divided (e.g., CK), and the cross-coupled circuit may include a frequency control input to receive a complementary input signal to be divided (e.g., $\overline{CK}$). While complementary signals CK and $\overline{CK}$ (i.e., signals that differ in phase by 180 degrees) are shown here for illustration, it is to be understood that some applications may use other input signals that have other phase differences such as I and Q signals, for example. The outputs of the differential and cross coupled circuits may be coupled together and used in a variety of applications, such as stages in a divider or ring oscillator, for example.

Figure 6:
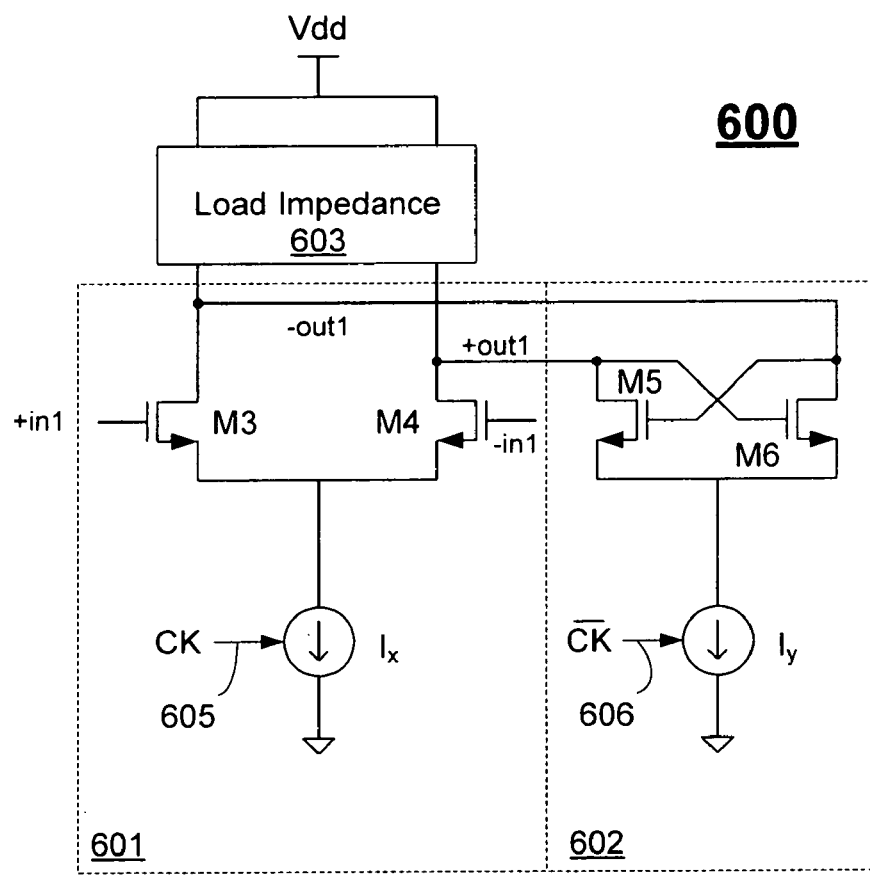
FIG. 6 illustrates an electronic circuit according to one embodiment of the present invention.

FIG. 6 illustrates an electronic circuit according to one embodiment of the present invention. Circuit 600 includes a differential circuit 601, cross-coupled circuit 602 and load impedance 603. Differential circuit 601 includes NMOS transistors M3 and M4 having sources coupled together and to current source Ix. The drains of M3 and M4 are coupled through load impedance 603 to supply terminal Vdd. A bias current, Ix, in differential circuit 601 is set by current source, Ix. Differential circuit 601 includes a frequency control input 605 for receiving a signal to be divided. Here the frequency control input 605 couples an input signal (designated here as CK) to the bias current Ix in differential circuit 601. Cross-coupled circuit 602 includes NMOS transistors M5 and M6 having sources coupled together. The drains of M5 and M6 are also coupled through load impedance 603 to supply terminal Vdd. The control terminal of M5 (e.g., here, the gate of NMOS transistor M5) is coupled to the drain of M6, and the control terminal of M6 (e.g., here, the gate of NMOS transistor M6) is coupled to the drain of M5. The bias current, Iy, in cross-coupled circuit 602 is set by current source, Iy. Cross-coupled circuit 602 also includes a frequency control input 606 for receiving a complement of the signal to be divided. Here frequency control input 606 couples the complement of the input signal (designated here as $\overline{CK}$) to the bias current Iy in cross-coupled circuit 602. Advantageously, the differential circuit bias current, Ix, is different than the cross-coupled circuit bias current, Iy. Currents Ix and Iy may be generated independently, for example.

One advantage of using different bias currents is that the lock performance of the circuit may be improved. The lock range is a function of the amplitude of oscillation and the center frequency, $\omega_c$, of the circuit. The amplitude of oscillation is given by the following equation:

$$Vs=4IyR/\pi,$$

where R is the resistance of the load impedance. The center frequency of the circuit is given by:

$$\omega_c=(1/RC)Ix/Iy,$$

where R is the resistance of the load impedance and C is the capacitance at the output nodes (i.e., +out1 and −out1). In one embodiment, Iy is maintained constant using a constant process and temperature invariant current source, and the differential bias current source, Ix, is calibrated so that the ratio of a differential bias current and a resistance is a constant (i.e., Ix/R=constant). In another embodiment, Ix is maintained constant using a constant process and temperature invariant current source, and the cross-coupled bias current source, Iy, is calibrated so that the product of a cross-coupled bias current and a resistance is a constant (i.e., R*Iy=constant).

Figure 7:
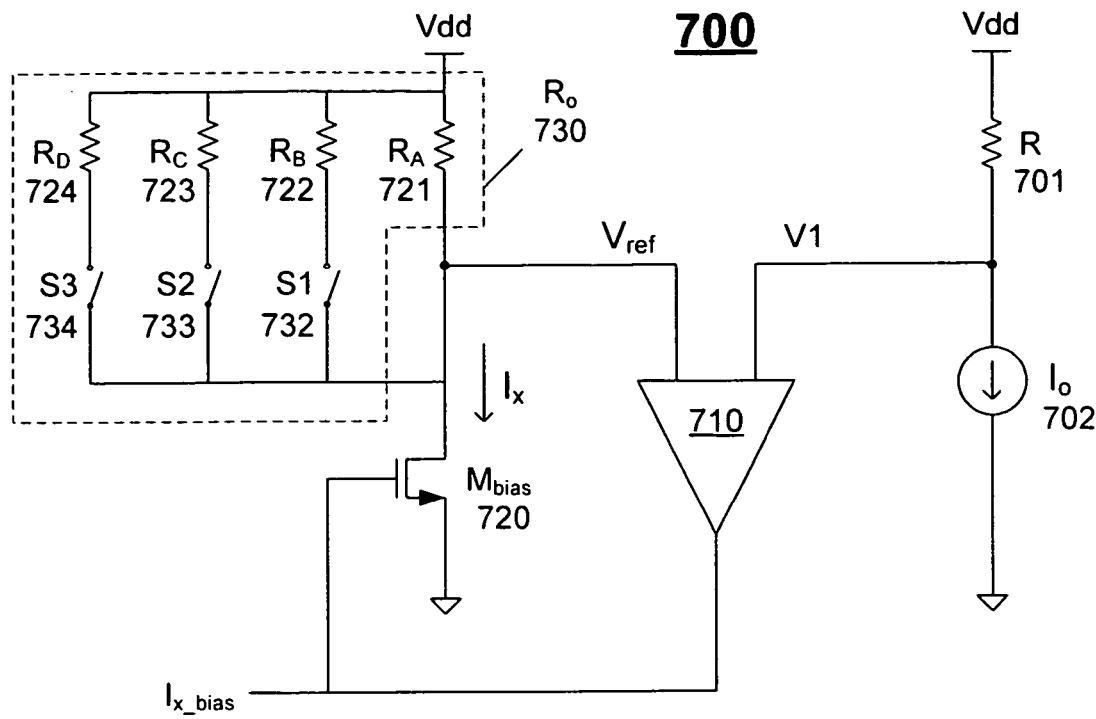
FIG. 7 illustrates a bias generator according to one embodiment of the present invention.

FIG. 7 illustrates a bias generator 700 according to one embodiment of the present invention. Bias generator 700 generates a bias voltage, Ix_bias, that may be used to produce a current, Ix, for constant Ix/R. Bias generator 700 includes a resistor ("R") 701, which may be a replica of a resistor used in load impedance 603 of FIG. 6. Thus, as a resistor in the load impedance varies with process and temperature, resistor 701 will vary in a substantially similar manner. Resistor 701 is coupled to a process and temperature invariant current source ("Io") 702. Thus, the current Io will generate a voltage, V1=R*Io, which will change with process and temperature as resistor 701 changes with process and temperature. V1 is coupled to an input of a differential amplifier 710. The other input of differential amplifier 710 is coupled to a reference voltage, Vref, which may be a calibrated reference voltage, for example. For instance, voltage, Vref, may be generated using a variable resistor 730 ("Ro") coupled in series with transistor 720 ("Mbias") between reference voltages, such as Vdd and ground. In this example, variable resistor 730 is a switched resistor network, which may comprise a plurality of resistors (e.g., resistors 721-724, $R_A$, $R_B$, $R_C$ and $R_D$) and switches (e.g., switches 732-734). Switches 732-734 may be MOS transistor switches, for example. It is to be understood that other variable resistor techniques or switching techniques may be used. Variable resistor 730 is coupled to the drain of transistor 720, and the gate of transistor 720 is coupled to the output of differential amplifier 710. The output of differential amplifier 710, Ix_bias, is also used as the bias voltage for other stages in the circuit (e.g., the differential stage of FIG. 5 or 6). Thus, the current in transistor 720, Ix, is a replica of the current in such stages.

Since the output of differential amplifier 710 is coupled back to the differential amplifier input, the feedback action will result in V1 and Vref being approximately equal. Variable resistor, Ro, can be calibrated using resistors 722-724 and switches 732-734. Such calibration may include a calibration for process variations (e.g., a one time process calibration) or a real-time calibration for temperature variations, or both, resulting in a substantially constant value for Ro. Since Io is a constant current source, the ratio of Io/Ro is constant. Constant Ix/R can be seen from the following equations:

$$Vref=V1$$

$$Ix*Ro=Io*R$$

$$Ix/R=Io/Ro$$

Therefore, since the voltage at the output of differential amplifier 710, Ix_bias, is used as the bias voltage for other stages in the circuit (e.g., the differential stage of FIG. 5 or 6), the ratio of the bias current, Ix, and resistance, R, will be constant. Consequently, the center frequency of the circuit may be maintained across process and temperature variations so that the lock range of the circuit is optimized.

Maintaining a constant Ix/R, as illustrated above, will ensure that the center frequency of the oscillator will not vary with process or temperature. However, variation of resistance in the load impedance will also affect amplitude. For example, if the process resistance is low, the amplitude may be reduced and higher currents may be required for the circuit to operate properly. Alternatively, if the process resistance is high, the amplitude may be increased, which means that the circuit has more current than necessary for proper operation. Amplitude variations thus translate into increased power consumption because the current in the circuit is not optimized. To reduce the adverse effects of both center frequency variation and amplitude variation, embodiments of the present invention may use a constant current source for Ix, and use another bias generator that may be used to produce a cross-coupled bias current, Iy, wherein the product of Iy and a load resistance is a constant (i.e., R*Iy=constant).

Figure 8:
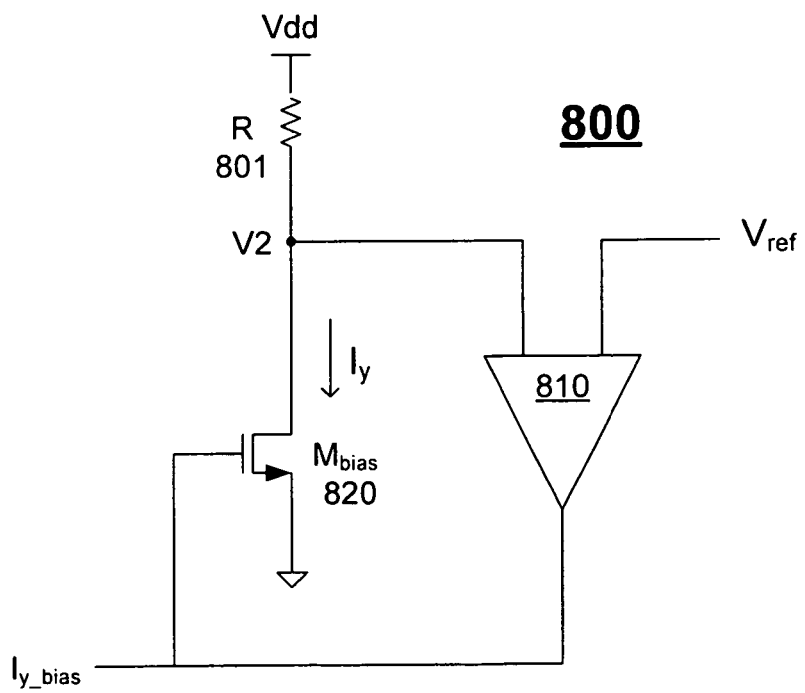
FIG. 8 illustrates a bias generator according to another embodiment of the present invention.

FIG. 8 illustrates a bias generator 800 according to another embodiment of the present invention. Bias generator

800 generates a bias voltage, Iy_bias, that may be used to produce a current, Iy, for constant Iy*R. Bias generator 800 includes a resistor ("R") 801, which may be a replica of a resistor used in load impedance 603 of FIG. 6. Thus, as a resistor in the load impedance varies with process and temperature, resistor 801 will vary in a substantially similar manner. Resistor 801 is coupled to the drain of transistor 820 ("Mbias"). The current Iy through transistor 820 and resistor R will produce a voltage, V2, which is coupled to an input of differential amplifier 810. The other input to amplifier 810 is coupled to a reference voltage, Vref, which is substantially process and temperature invariant (i.e., substantially constant). The output of amplifier 810 is coupled to the gate of transistor 820. The output of differential amplifier 810, Iy_bias, is also used as the bias voltage for other stages in the circuit (e.g., the cross-coupled stage of FIG. 5 or 6). Thus, the current in transistor 820, Iy, is a replica of the current in such stages.

Since the output of differential amplifier 810 is coupled back to the differential amplifier input, the feedback action will result in V2 and Vref being approximately equal. Vref may be maintained constant across process and temperature. Thus, constant Iy*R can be seen from the following equations:

$$V2 = Vref$$

$$Iy*R = Vref = \text{Constant}$$

Therefore, since the voltage at the output of differential amplifier 810, Iy_bias, is used as the bias voltage for other stages in the circuit (e.g., the cross-coupled stage of FIG. 5 or 6), the product of the bias current, Iy, and resistance, R, will be constant. Consequently, the center frequency and amplitude of the circuit may be maintained across process and temperature variations so that both the lock range and power consumption of the circuit are optimized.

Figure 9:
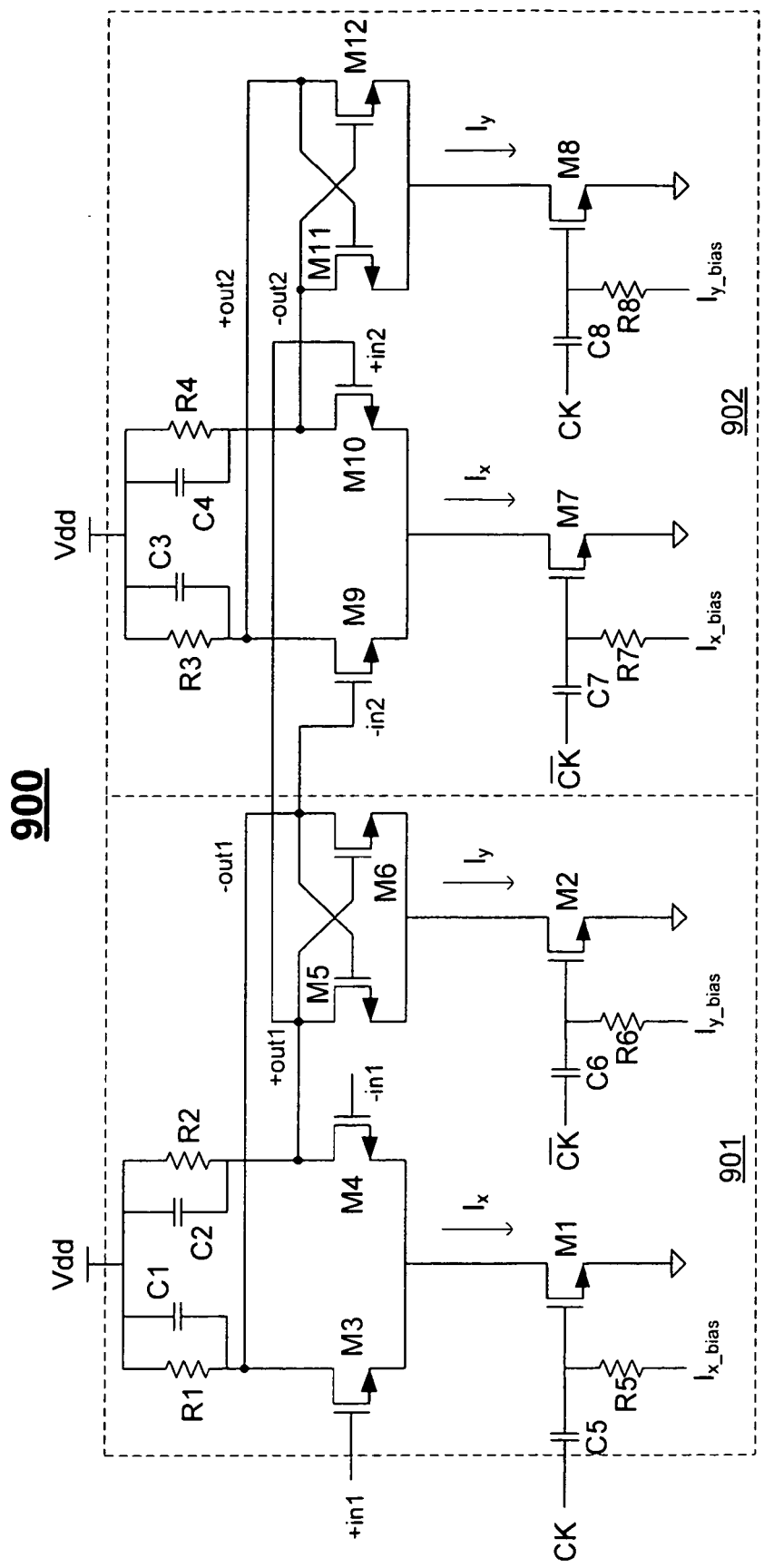
FIG. 9 illustrates a divider circuit according to one embodiment of the present invention.

FIG. 9 illustrates a divider circuit according to one embodiment of the present invention. Divider circuit 900 includes first and second stages 901 and 902. Each stage includes a differential circuit (e.g., M3-M4 and M9-M10) and a cross-coupled circuit (e.g., M5-M6 and M11-M12) coupled to a load impedance such as resistors R1-R4 and capacitors C1-C4. Inductors may also be included in certain high frequency applications but have been omitted here. Each differential circuit includes a bias current, Ix, and each cross-coupled circuit includes a bias current Iy. Each differential circuit further includes a frequency control input. Here the frequency control inputs are the control terminals of transistors M1 and M7, which in this example are NMOS devices. When the input signals are received on the control terminals of M1 or M7 (i.e., input signals CK and $\overline{CK}$, respectively), each transistor will generate an AC current component of the input signal on bias current Ix, which will couple into the corresponding differential circuit. Each cross-coupled circuit also includes a frequency control input. Here the frequency control inputs are the control terminals of transistors M2 and M8, which in this example are NMOS devices. When the input signals are received on the control terminals of M2 or M8 (i.e., input signals $\overline{CK}$ and CK, respectively), each transistor will generate an AC current component of the input signal on bias current Iy, which will couple into the corresponding cross-coupled circuit.

In this example, the bias current values in the differential circuit and cross-coupled circuit are set by bias voltages. Bias voltage Ix_bias is coupled to the control terminals of NMOS transistors M1 and M7 through resistors R5 and R7, respectively. Bias voltage Iy_bias is coupled to the control terminals of NMOS transistors M2 and M8 through resistors R6 and R8, respectively. In each stage, the differential circuit receives a bias voltage Ix_bias to produce a bias current Ix, and the cross-coupled circuit receives a bias voltage Iy_bias to produce a bias current Iy. Bias voltages Ix_bias and Iy_bias may be generated by bias generators (not shown), which may be of the type described above and illustrated in FIGS. 7-8, for example. The bias generators may include replicas of load resistors R1-R4. Such resistors may be designed to have the same resistance values, but the values may be slightly different after manufacturing. Replica resistors may be used to tune the circuit so that the ratio of Ix/R is constant over process or temperature or both. Replica resistors may also be used to tune the circuit so that the product of Iy*R is constant over process or temperature or both.

Figure 10:
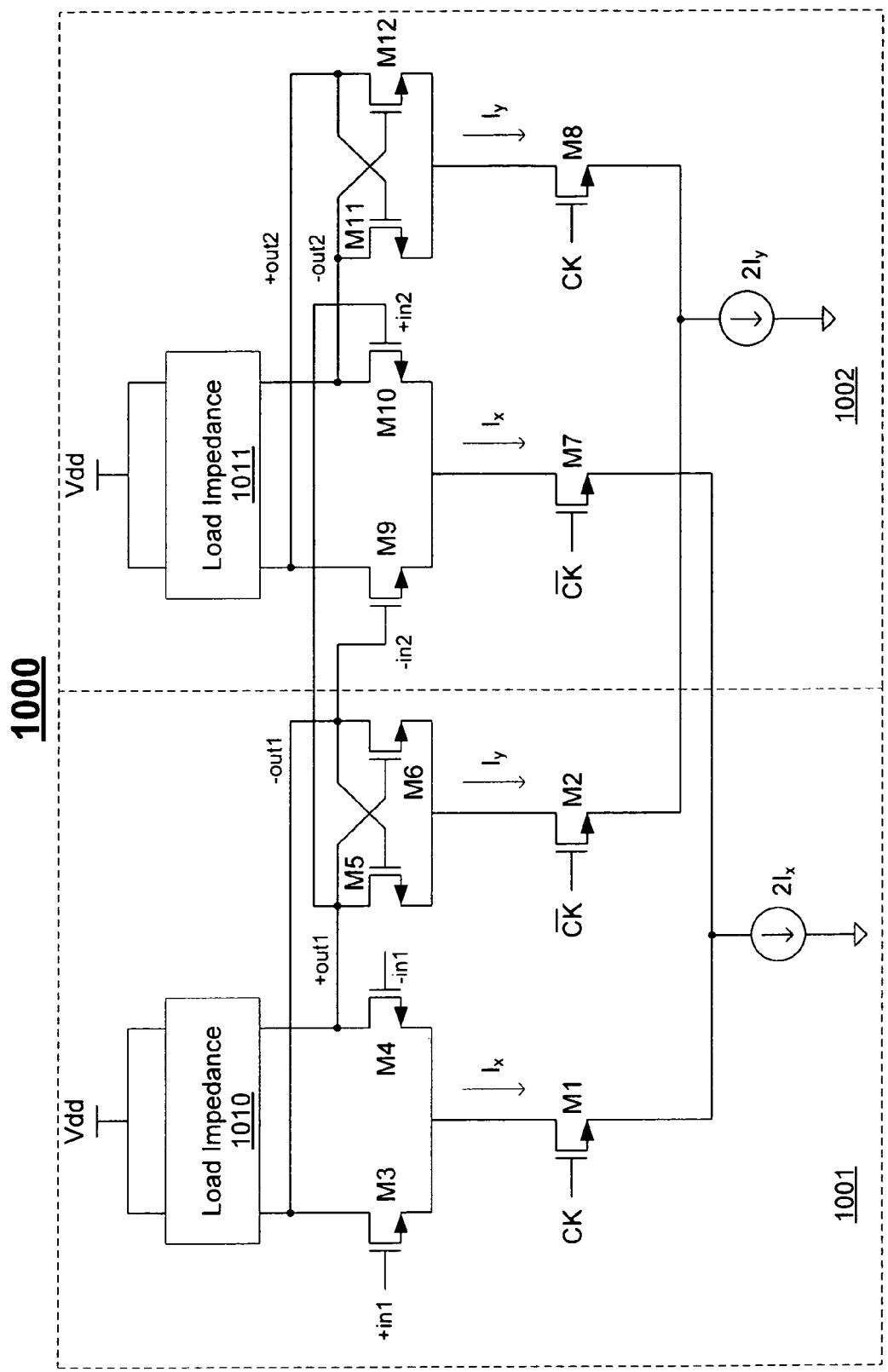
FIG. 10 illustrates a divider circuit according to another embodiment of the present invention.

FIG. 10 illustrates a divider circuit according to another embodiment of the present invention. Divider circuit 1000 includes first and second stages 1001 and 1002. Each stage includes a differential circuit (e.g., M3-M4 and M9-M10) and a cross-coupled circuit (e.g., M5-M6 and M11-M12) coupled to a load impedance (e.g., 1010 and 1011). Load impedances 1010 and 1011 may include resistors, inductors and capacitors, for example, and the inductors or capacitors may include parasitic inductance or capacitance. In this example, the bias currents in the differential circuit and cross-coupled circuit are set by bias generators. Bias current 2Ix is coupled to the source terminals of NMOS transistors M1 and M7. Thus, each of these devices has a current of Ix. Bias current 2Iy is coupled to the source terminals of NMOS transistors M2 and M8. Thus, each of these devices has a current of Iy. Therefore, each differential circuit receives a bias current Ix, and each cross-coupled circuit receives a bias current Iy. Bias generators 2Ix and 2Iy may be of the type described above and illustrated in FIGS. 7-8, for example, for generating constant Ix/R or Iy*R over process or temperature or both.

Figure 11:
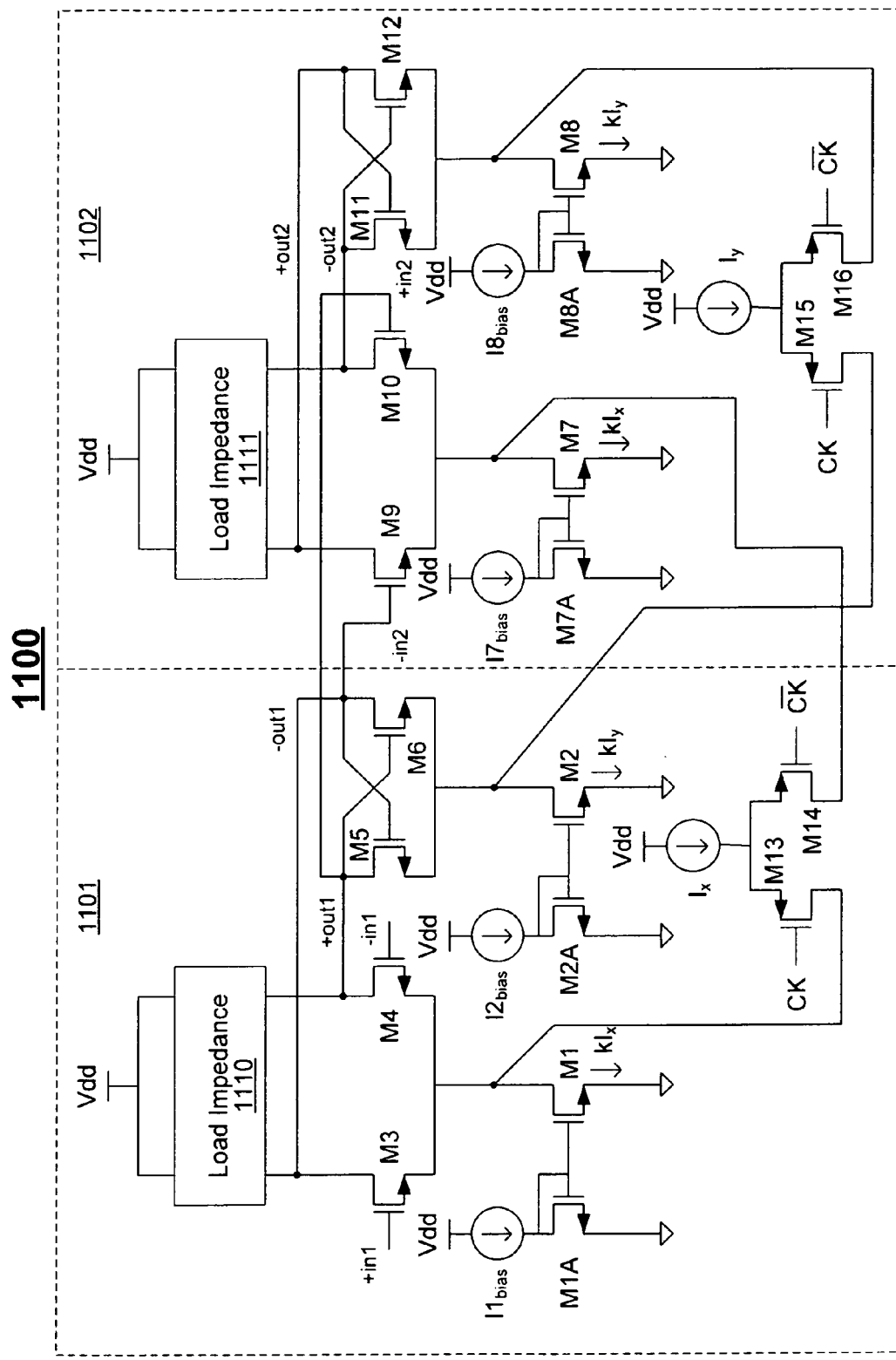
FIG. 11 illustrates a divider circuit according to yet another embodiment of the present invention.

FIG. 11 illustrates a divider circuit according to yet another embodiment of the present invention. Divider circuit 1100 is an example of a folded cascade implementation, which is particularly advantageous for low supply voltage applications. Divider circuit 1100 includes first and second stages 1101 and 1102. Each stage includes a differential circuit (e.g., M3-M4 and M9-M10) and a cross-coupled circuit (e.g., M5-M6 and M11-M12) coupled to a load impedance (e.g., 1110 and 1111). Load impedances 1110 and 1111 may include resistors, inductors and capacitors, for example, and the inductors or capacitors may include parasitic inductance or capacitance. In this example, the bias currents in the differential circuit and cross-coupled circuit are set by bias generators.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims. The terms and expressions that have been employed here are used to describe the various embodiments and examples. These terms and expressions are not to be construed as excluding equivalents of the features shown and described, or portions thereof, it being recognized that various modifications are possible within the scope of the appended claims.

What is claimed is:

1. A divider circuit comprising:
   a differential circuit having first and second inputs to receive a first differential signal and first and second differential output nodes, wherein the differential circuit has a first bias current generated by a first bias generator; and
   a cross-coupled circuit having a first control terminal coupled to a second output of the cross-coupled circuit and the first differential output node and a second control terminal coupled to a first output of the cross coupled circuit and the second differential output node, and wherein the cross-coupled circuit has a second bias current generated by a second bias generator that is independent of the first bias current,
   wherein the differential circuit is coupled to a first transistor having a control terminal to receive a signal to be divided, and wherein the first bias generator is coupled to the differential circuit through the first transistor, and
   wherein the cross-coupled circuit is coupled to a second transistor having a control terminal to receive the complement of the signal to be divided, and wherein the second bias generator is coupled to the cross-coupled circuit through the second transistor.

2. The divider circuit of claim 1 wherein the second bias current is a constant current and the first bias current is calibrated so that die ratio of the first bias current and a resistance is a constant.

3. The divider circuit of claim 1 wherein the first bias current is a constant current and the second bias current is calibrated so that the product of the second bias current and a resistance is a constant.

4. The divider circuit of claim 1 further comprising a first resistor having a first resistance coupled between the first differential output node and a supply terminal and a second resistor having a second resistance coupled between the second differential output node and the supply terminal, wherein the first bias generator is calibrated so that the ratio of the first bias current and the first or second resistance is a constant across process or temperature.

5. The divider circuit of claim 1 further comprising a first resistor having a first resistance coupled between the first differential output node and a supply terminal and a second resistor having a second resistance coupled between the second differential output node and the supply terminal, wherein the second bias generator is calibrated so that the product, of the second bias current and the first or second resistance is a constant across process or temperature.

6. The divider circuit of claim 1 further comprising a load impedance coupled between first and second differential output nodes and a supply voltage, the load impedance including a control terminal for changing the impedance between the first and second differential output nodes and the supply voltage.

7. A divider circuit comprising:
   a differential circuit having first and second inputs to receive a first differential signal, and first and second differential output nodes, wherein the differential circuit is coupled to a first bias current generator; and
   a cross-coupled circuit having a first control terminal coupled to a second output of the cross-coupled circuit and the first differential output node and a second control terminal coupled to a first output of the cross coupled circuit and the second differential output node, wherein the cross-coupled circuit is coupled to a second bias current generator,
   wherein the differential circuit is coupled to a first transistor having a control terminal for receiving a signal to be divided, and wherein the first bias current generator is coupled to the differential circuit through the first transistor, and
   wherein the cross-coupled circuit is coupled to a second transistor having a control terminal for receiving the complement of the signal to be divided, and wherein the second bias current generator is coupled to the differential circuit through the second transistor.

8. The divider circuit of claim 7 further comprising a first resistor coupled between the first differential output node and a supply terminal and a second resistor coupled between the second differential output node and the supply terminal, the first and second resistors having approximately equal resistance values, wherein the first bias current generator includes a third resistor having an approximately equal resistance value as the first and second resistors for generating a replica current, wherein, the ratio of the replica current and the resistance value of the third resistor is a constant across process or temperature.

9. The divider circuit of claim 7 further comprising a first resistor coupled between the first differential output node and a supply terminal and a second resistor coupled between the second differential output node and the supply terminal, die first and second resistors having approximately equal resistance values, wherein the first bias current generator includes a third resistor having an approximately equal resistance value as the first and second resistors for generating a replica current, wherein the product of the replica current and the resistance value of the third resistor is a constant across process or temperature.

10. The divider circuit or claim 7 wherein the first bias current generator is coupled through the first transistor in a folded cascade configuration.

11. The divider circuit of claim 7 wherein the second bias current generator is coupled through the second transistor in a folded cascade configuration.

12. A divider circuit comprising:
   first and second transistors having sources coupled together to form a differential circuit, the first transistor having a first output terminal and the second transistor having a second output terminal;
   first and second cross-coupled transistors having sources coupled together, the first cross-coupled transistor having a first output terminal coupled to the first output terminal of the first transistor and the second cross-coupled transistor having a second output terminal coupled to the second output terminal of the second transistor;
   a first resistor coupled between the first output terminal of the first transistor and a supply terminal, the first resistor having a first resistance value;
   a second resistor coupled between the second output terminal of the second transistor and the supply terminal, the second resistor having a second resistance value approximately equal to the first resistance value;
   a third transistor having a control terminal coupled to a signal to be divided and a first terminal coupled to the sources of the first and second transistors, wherein the third transistor is coupled to a first bias generator that generates first bias current in the first and second transistors; and a fourth transistor having an control terminal coupled to a complement of the signal to be divided and a first terminal coupled to the sources of the cross-coupled transistors, wherein the fourth transistor is coupled to a second bias generator that generates second bias current in the first and second cross-coupled transistors.

13. The divider circuit of claim 12, wherein the first bias generator is calibrated so that the ratio of the first bias current arid the first resistance value is constant across process or temperature.

14. The divider circuit of claim 13 wherein the first bias generator comprises a third resistor having a third resistance value approximately equal to the first resistance value, an amplifier, and a fifth transistor coupled between a first amplifier input and an output of the amplifier for generating a replica current in the fifth transistor, wherein the ratio of the replica current and the first resistance value is a constant across process or temperature.

15. The divider circuit of claim 12 wherein the second bias generator is calibrated so that the product of the second bias current and the first resistance value is a constant across process or temperature.

16. The divider circuit of claim 15 wherein the second bias generator comprises a third resistor having a third resistance value approximately equal to the first resistance value, an amplifier, and a fifth transistor coupled between a first amplifier input and an output of the amplifier for generating a replica current in the fifth transistor, wherein the product of the replica current and the first resistance value is a constant across process or temperature.

17. The divider circuit of claim 12 wherein first bias generator is coupled to the control terminal of the third transistor and the second bias generator is coupled to the control terminal of the fourth transistor.

18. The divider circuit of claim 12 wherein first bias generator is coupled to a second terminal of the third transistor and the second bins generator is coupled to a second terminal of the fourth transistor.

19. A divider circuit comprising:
a differential circuit having first and second inputs to receive a first differential signal and first and second differential output nodes;
a cross-coupled circuit having a first control terminal coupled to a second output of the cross-coupled circuit and the first differential output node and a second control terminal coupled to a first output of the cross coupled circuit and the second differential output node;
a first transistor coupled to the differential circuit;
a second transistor coupled to the cross coupled circuit;
first bias means for biasing the differential circuit with a first bias current coupled to the differential circuit through the first transistor; and
second bias means for biasing the cross-coupled circuit with a second bias current coupled to the cross-coupled circuit through the second transistor.

20. The divider circuit of claim 19 wherein the second bias means generates a constant current and the first bias means is calibrated so that the ratio of the first bias current and a resistance is a constant.

21. The divider circuit of claim 19 wherein the first bias means generates a constant current and the second bias means is calibrated so that the product of the second bias current and a resistance is a constant.

22. The divider circuit of claim 19 further comprising means for calibrating the first bias means.

23. The divider circuit of claim 19 further comprising means for calibrating the second bias means.

24. A method of dividing a signal comprising:
receiving a first input signal to be divided on a frequency control input of a first transistor;
receiving a complement of the first input signal on a frequency control input of a second transistor;
coupling the first input signal to a differential circuit;
coupling the complement of the first input signal to a cross-coupled circuit;
coupling a first bias current through the first transistor to the differential circuit using a first bias current generator;
coupling a second bias current through the second transistor to the cross-coupled circuit using a second bias current generator;
operating the differential circuit using the first bias current; and
operating the cross-coupled circuit using the second bias current.

25. The method of claim 24 wherein the first and second bias current generators output first and second voltages, and wherein the first voltage is coupled to a control terminal of the first transistor for generating the first bias current in the differential circuit, and wherein the second voltage is coupled to a control terminal of the second transistor for generating the second bias current.

26. The method of claim 24 wherein the first and second bias current generators output first and second currents, and wherein the first voltage is coupled to a terminal of the first transistor for generating the first bias current in the differential circuit, and wherein the second current is coupled to a terminal of the second transistor for generating the second bias current.

27. The method of claim 26 wherein the first and second bias current generators are folded cascade circuits.

28. The method of claim 24 wherein the second bias current is a constant current and the first bias current is calibrated so that the ratio of the first bias current and a resistance is a constant.

29. The method of claim 24 wherein the first bias current is a constant current and the second bias current is calibrated so that the product of the second bias current and a resistance is a constant.

30. The method of claim 24 wherein the second bias current is independent of the first bias current.

* * * * *